United States Patent
Sugiyama et al.

(10) Patent No.: US 12,119,613 B2
(45) Date of Patent: Oct. 15, 2024

(54) SINTERED BODY, SPUTTERING TARGET, FILM, QUANTUM CASCADE LASER, AND METHOD OF FILM FORMATION

(71) Applicant: HAMAMATSU PHOTONICS K.K., Hamamatsu (JP)

(72) Inventors: Atsushi Sugiyama, Hamamatsu (JP); Akio Ito, Hamamatsu (JP); Tadataka Edamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 1087 days.

(21) Appl. No.: 16/985,916

(22) Filed: Aug. 5, 2020

(65) Prior Publication Data

US 2021/0057875 A1 Feb. 25, 2021

(30) Foreign Application Priority Data

Aug. 21, 2019 (JP) .................................. 2019-150935
Feb. 26, 2020 (JP) .................................. 2020-030619

(51) Int. Cl.
| | | |
|---|---|---|
| *H01S 5/028* | (2006.01) | |
| *G02B 1/113* | (2015.01) | |
| *H01S 5/16* | (2006.01) | |
| *H01S 5/34* | (2006.01) | |
| *H01S 5/12* | (2021.01) | |
| *H01S 5/22* | (2006.01) | |

(52) U.S. Cl.
CPC ............ *H01S 5/0287* (2013.01); *G02B 1/113* (2013.01); *H01S 5/166* (2013.01); *H01S 5/3402* (2013.01); *H01S 5/12* (2013.01); *H01S 5/22* (2013.01)

(58) Field of Classification Search
CPC ........ H01S 5/12; H01S 5/3401; H01S 5/3402; H01S 5/0287; H01S 5/0288; G02B 1/113
See application file for complete search history.

(56) References Cited

U.S. PATENT DOCUMENTS

| | | | |
|---|---|---|---|
| 3,958,042 A | 5/1976 | Katsube et al. | |
| 2010/0046568 A1* | 2/2010 | Maulini ................ | G02B 1/115 372/49.01 |
| 2013/0322479 A1* | 12/2013 | Sugiyama ............ | H01S 5/3401 372/45.01 |
| 2013/0322480 A1* | 12/2013 | Edamura ................ | H01S 5/12 372/45.01 |

FOREIGN PATENT DOCUMENTS

| | | | |
|---|---|---|---|
| CN | 1607877 | * | 4/2005 |
| JP | H2-501666 A | | 6/1990 |
| JP | 2001-042274 A | | 2/2001 |
| JP | 2013-254764 A | | 12/2013 |
| JP | 2013-254765 A | | 12/2013 |
| JP | 2018-123365 A | | 8/2018 |
| JP | 2019-123872 A | | 7/2019 |
| JP | 2019-137919 A | | 8/2019 |
| WO | WO 88/001312 A1 | | 2/1988 |

* cited by examiner

*Primary Examiner* — Xinning (Tom) Niu
*Assistant Examiner* — Delma R Forde
(74) *Attorney, Agent, or Firm* — Faegre Drinker Biddle & Reath LLP

(57) ABSTRACT

A sintered body of the present invention includes cerium oxide and cerium fluoride or yttrium fluoride.

4 Claims, 8 Drawing Sheets

*Fig.5*

| SEMICONDUCTOR LAYER | | COMPOSITION | LAYER THICKNESS | DOPING |
|---|---|---|---|---|
| INJECTION BARRIER LAYER 171 | | InAlAs | 3.5nm | undoped |
| EMISSION LAYER 17 | WELL LAYER 161 | InGaAs | 3.2nm | undoped |
| | BARRIER LAYERS 172 | InAlAs | 2.3nm | undoped |
| | 162 | InGaAs | 7.7nm | undoped |
| | 173 | InAlAs | 0.7nm | undoped |
| | 163 | InGaAs | 6.0nm | undoped |
| | 174 | InAlAs | 1.3nm | undoped |
| | 164 | InGaAs | 5.4nm | undoped |
| EXIT BARRIER LAYER 191 | | InAlAs | 1.6nm | undoped |
| INJECTION LAYER 18 | WELL LAYER 181 | InGaAs | 4.1nm | undoped |
| | BARRIER LAYERS 192 | InAlAs | 1.4nm | undoped |
| | 182 | InGaAs | 3.8nm | undoped |
| | 193 | InAlAs | 1.5nm | undoped |
| | 183 | InGaAs | 3.6nm | undoped |
| | 194 | InAlAs | 1.6nm | undoped |
| | 184 | InGaAs | 3.6nm | Si doped: $1 \times 10^{17}/cm^3$ |
| | 195 | InAlAs | 2.0nm | Si doped: $1 \times 10^{17}/cm^3$ |
| | 185 | InGaAs | 3.6nm | Si doped: $1 \times 10^{17}/cm^3$ |
| | 196 | InAlAs | 2.3nm | Si doped: $1 \times 10^{17}/cm^3$ |
| | 186 | InGaAs | 3.6nm | undoped |
| | 197 | InAlAs | 2.6nm | undoped |
| | 187 | InGaAs | 3.5nm | undoped |

SINTERED BODY, SPUTTERING TARGET, FILM, QUANTUM CASCADE LASER, AND METHOD OF FILM FORMATION

CROSS-REFERENCE TO RELATED APPLICATION

The present application claims priority to Japanese Patent Application No. 2019-150935, filed on Aug. 21, 2019 and Japanese Patent Application No. 2020-30619, filed on Feb. 26, 2020. The contents of these applications are incorporated herein by reference in their entirety.

TECHNICAL FIELD

The present invention relates to a sintered body, a sputtering target, a film, a quantum cascade laser, and a method of film formation.

BACKGROUND

A quantum cascade laser is known as a high-performance semiconductor light source in a mid-infrared wavelength region (for example, wavelengths of 4 to 15 μm). In order to make a quantum cascade laser of a single mode or a higher output, it is important to control reflectance by forming a film on a cleaved emission end surface. For example, in a quantum cascade laser of a distributed feedback (DFB) type in which a diffraction grating is disposed in the element, theoretically, it is necessary to increase a film thickness (for example, 1 μm or more) of an anti-reflection film formed on the emission end surface and adjust a refractive index thereof (for example, 2 or less) as the wavelength becomes longer. In order to realize this, conventionally, forming a dielectric multilayer film in which dielectrics having different refractive indexes are laminated on an emission end surface is known (for example, see Japanese Unexamined Patent Publication No. 2013-254765). Although it is not a film formation technology for quantum cascade lasers, as a method of forming a single layer film whose refractive index can be controlled in a low refractive index region, a method of film formation in which vacuum deposition and sputtering are alternately repeated is known (see Japanese Unexamined Patent Publication No. 2018-123365).

SUMMARY

However, in the dielectric multilayer film described in Japanese Unexamined Patent Publication No. 2013-254765, there is a problem in that cracking or the like due to a difference in a coefficient of thermal expansion between different types of layers occurs in some cases and a problem of heat resistance of the materials when the quantum cascade laser is continuously driven. Therefore, it is desirable to realize a desired thickness and refractive index with a single layer film. Here, when the method of film formation disclosed in Japanese Unexamined Patent Publication No. 2018-123365 is used to form a film having a low refractive index, it is difficult to obtain a film having sufficient strength to withstand use in a mid-infrared wavelength region.

Therefore, an objective of the present invention is to provide a material which can be used for forming a film having a desired thickness and refractive index with a single layer. Another objective is to provide a film including the material, a quantum cascade laser in which a film including the material is provided, and a method of forming a film including the material.

The present invention provides a sintered body including cerium oxide and cerium fluoride or yttrium fluoride. The sintered body can be used as a sputtering target. When sputtering is performed using the sintered body as a sputtering target, a thick film having a low refractive index, which cannot be achieved by using cerium oxide alone, can be formed.

Here, a content of the cerium fluoride or the yttrium fluoride may be 10 to 30% by mass with respect to a total mass of the cerium oxide and the cerium fluoride or the yttrium fluoride. Particularly, when the content is within this range, a thick film having a low refractive index can be formed, and a low reflectance can be achieved with a single layer film. Also, strength as a sputtering target can be more sufficiently maintained and it can withstand repeated use.

Also, the present invention provides a film including cerium oxide and cerium fluoride or yttrium fluoride and having a thickness of 1.000 to 1.300 μm. The film may be formed on an emission end surface of a quantum cascade laser. According to the film, even when a high-output laser is continuously driven, deterioration due to heat does not easily occur.

Further, the present invention provides a quantum cascade laser including a semiconductor substrate, and an active layer provided on the semiconductor substrate, having a cascade structure in which quantum well emission layers and injection layers are alternately laminated by multistage-laminating unit laminates each formed of the quantum well emission layer and the injection layer, and configured to generate light due to inter-subband transition in a quantum well structure, in which an anti-reflection film is provided on an emission end surface from which light having a predetermined wavelength generated in the active layer is emitted, and the anti-reflection film is formed of a single layer film including cerium oxide and cerium fluoride or yttrium fluoride. In the quantum cascade laser, even when a high-output laser is continuously driven, deterioration of the anti-reflection film due to heat does not easily occur, and cracking or the like does not easily occur.

In the anti-reflection film of the quantum cascade laser, a content of the cerium fluoride or the yttrium fluoride may be 10 to 30% by mass with respect to a total mass of the cerium oxide and the cerium fluoride or the yttrium fluoride.

Also, the present invention provides a method of film formation in which a sintered body including cerium oxide and cerium fluoride or yttrium fluoride is used as a sputtering target. The method of film formation may be used to form an anti-reflection film on an emission end surface of a quantum cascade laser by sputtering.

In the method of film formation, sputtering may be performed in an inert gas atmosphere of a sputtering apparatus with oxygen present at a partial pressure ratio of 1 to 15%. According to this, surface roughness of the formed film can be made small.

According to the present invention, it is possible to provide a material which can be used for forming an anti-reflection film having a desired thickness and refractive index with a single layer. Also, a film including the material, a quantum cascade laser in which a film including the material is provided, and a method of forming a film including the material can be provided.

BRIEF DESCRIPTION OF THE DRAWINGS

FIG. 5 is a chart showing an example of a structure of a unit laminate for one period in the active layer.

DETAILED DESCRIPTION

Figure 1:
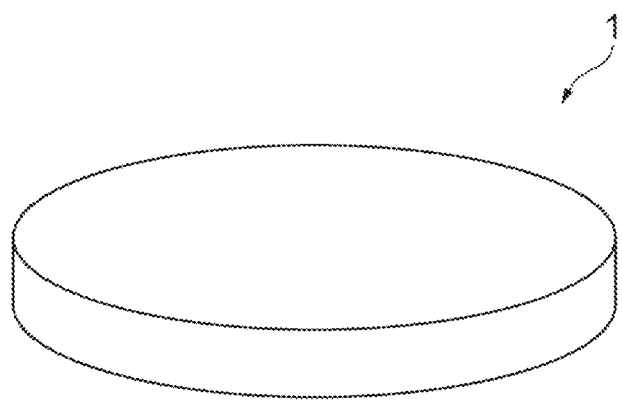
FIG. 1 is a perspective view illustrating a configuration of one embodiment of a sputtering target.

Hereinafter, preferred embodiments of the present embodiment will be described in detail with reference to the drawings. In the drawings, the same or corresponding portions are denoted by the same reference signs, and duplicate descriptions thereof will be omitted.

<Sintered Body, Sputtering Target>

As illustrated in FIG. 1, a sputtering target (hereinafter, simply referred to as a "target") 1 of the present embodiment is a flat plate-shaped columnar body. A size of the target 1 can be arbitrarily adjusted depending on a mode of sputtering, but a diameter of the column is, for example, preferably 50 to 100 mm, more preferably 60 to 90 mm, and still more preferably 70 to 80 nm. A height of the column is preferably 1 to 10 mm, more preferably 2 to 8 mm, and still more preferably 3 to 6 mm.

The target 1 is a sintered body of a mixture of cerium oxide and cerium fluoride or yttrium fluoride. Accordingly, the target 1 includes cerium oxide and cerium fluoride or yttrium fluoride. A content of the cerium fluoride or the yttrium fluoride may be 10 to 30% by mass (wt %) or 15 to 25% by mass with respect to a total mass of the cerium oxide and the cerium fluoride or the yttrium fluoride.

In a case in which a substance included together with the cerium oxide is cerium fluoride, when a content of the cerium fluoride is within the range described above, a refractive index of a film formed by sputtering using the target 1 tends to be a value of 2 or less. Also, a target consisting of only cerium fluoride is brittle and has low durability against electric discharge, but when the cerium fluoride is mixed with cerium oxide, the durability becomes high.

In a case in which a substance included together with the cerium oxide is yttrium fluoride, when a content of the yttrium fluoride is within the range described above, a refractive index of a film formed by sputtering using the target 1 tends to be a value of 2 or less. Also, a film formed by sputtering using a target consisting of only yttrium fluoride is too high in stress and cracking or the like is likely to occur, but when a target in which the yttrium fluoride is mixed with cerium oxide is used, a stress of the film tends to be appropriate and cracking or the like is less likely to occur.

In the target 1, a total content of cerium oxide and cerium fluoride or yttrium fluoride is preferably 95% by mass or more, more preferably 98% by mass or more, still more preferably 99% by mass or more, and particularly preferably 99.5% by mass or more with respect to a mass of the target 1. Also, it is preferable that the target 1 substantially consist of cerium oxide and cerium fluoride or yttrium fluoride. Here, "substantially consist of cerium oxide and cerium fluoride or yttrium fluoride" means that impurities which are inevitably mixed in the manufacturing process of the sintered body may be included therein. It means that impurities that are inevitably mixed, for example, in a purification process of cerium oxide, cerium fluoride, and yttrium fluoride, a mixing process thereof, and a sintering process of the mixture thereof may be included. Also, the target 1 may consist of only cerium oxide and cerium fluoride or yttrium fluoride.

The target 1 can be manufactured by sintering a mixture of cerium oxide and cerium fluoride or yttrium fluoride. When a case in which cerium oxide and cerium fluoride are included is taken as an example, a granular agglomerate of cerium oxide and a granular agglomerate of cerium fluoride are each pulverized into fine granularity and are uniformly mixed at a desired mixing ratio. Then, the mixture is packed in a mold, compression molded, and sintered at a maximum temperature of 900° C. In this way, the target 1 including cerium oxide and cerium fluoride can be manufactured.

<Method of Film Formation, Film (Anti-Reflection Film)>

Film formation can be performed on an arbitrary object by sputtering using the target 1. A film obtained by sputtering is a single layer film, and a composition of substances constituting the target 1, that is, a composition having a predetermined content ratio of cerium oxide and cerium fluoride or yttrium fluoride, is a composition of the single layer film. A thickness of the single layer film can be 1.000 to 1.300 μm, may be 1.050 to 1.250 μm, or may be 1.100 to 1.200 μm. Also, a refractive index of the single layer film can be made 2 or less for light having a wavelength of 7 μm or more.

As a sputtering apparatus, an arbitrary apparatus can be used. When sputtering is performed, oxygen is preferably present at a partial pressure ratio of 1 to 15%, more preferably present at 3 to 10%, and still more preferably present at 5 to 8% in an inert gas atmosphere of a sputtering apparatus. According to this, oxygen atoms released from the film due to high electric discharge power can be supplemented, and surface roughness of the formed film can be reduced. When the oxygen partial pressure is too high, a film formation rate tends to decrease. As the inert gas, for example, argon can be used.

Here, a case in which an anti-reflection film is formed on an emission end surface of a quantum cascade laser by sputtering using the target 1 will be described. For a quantum cascade laser exhibiting a wavelength of 7 μm or more and high output, control of reflectance on the emission end surface is important. In other words, since the emission end surface is required to have appropriate insulation, refractive index, transparency at a design wavelength, stability in air, heat resistance, or the like in accordance with a device structure and characteristics of a quantum cascade laser, a film that is suitable for the requirements is formed. In a quantum cascade laser of a distributed feedback (DFB) type, a reflectance of the anti-reflection film formed on the emission end surface of 0 is ideal, and theoretically, as the design wavelength becomes longer, it is necessary to increase a film thickness of the anti-reflection film (for example, 1 μm or more) and reduce its refractive index (for example, 2 or less).

Here, a relationship among a film thickness of the anti-reflection film, various refractive indexes, and a design wavelength is as follows.

$$n_f = \sqrt{n_0 n_s}$$

$$n_f \cdot d = \frac{\lambda}{4}$$

In the expression, $n_f$ indicates a refractive index of the anti-reflection film, $n_0$ indicates a refractive index of air, $n_s$ indicates a refractive index of a base material, d indicates a film thickness (μm) of the anti-reflection film, and λ indicates a design wavelength (μm).

In the expression, when the refractive index of air $n_0$=1, the design wavelength λ=8 μm, and, for example, when the base material is InP (the refractive index is about 3.2), the following $n_f$ and d are established, $$n_f = \sqrt{3.2} = 1.789$$
$$d = \frac{\lambda}{4n_f} = \frac{8}{7.156} = 1.118$$

and it can be ascertained that a single layer film with a reflectance of 0 at the wavelength of 8 μm can be obtained when a material having a refractive index of 1.789 is formed to a film thickness of 1.118 μm. According to the film formation by sputtering using the target 1 of the present embodiment, an anti-reflection film having the refractive index and the film thickness can be realized as a single layer film. In addition, the anti-reflection film can also function as an insulating film.

Figure 6:
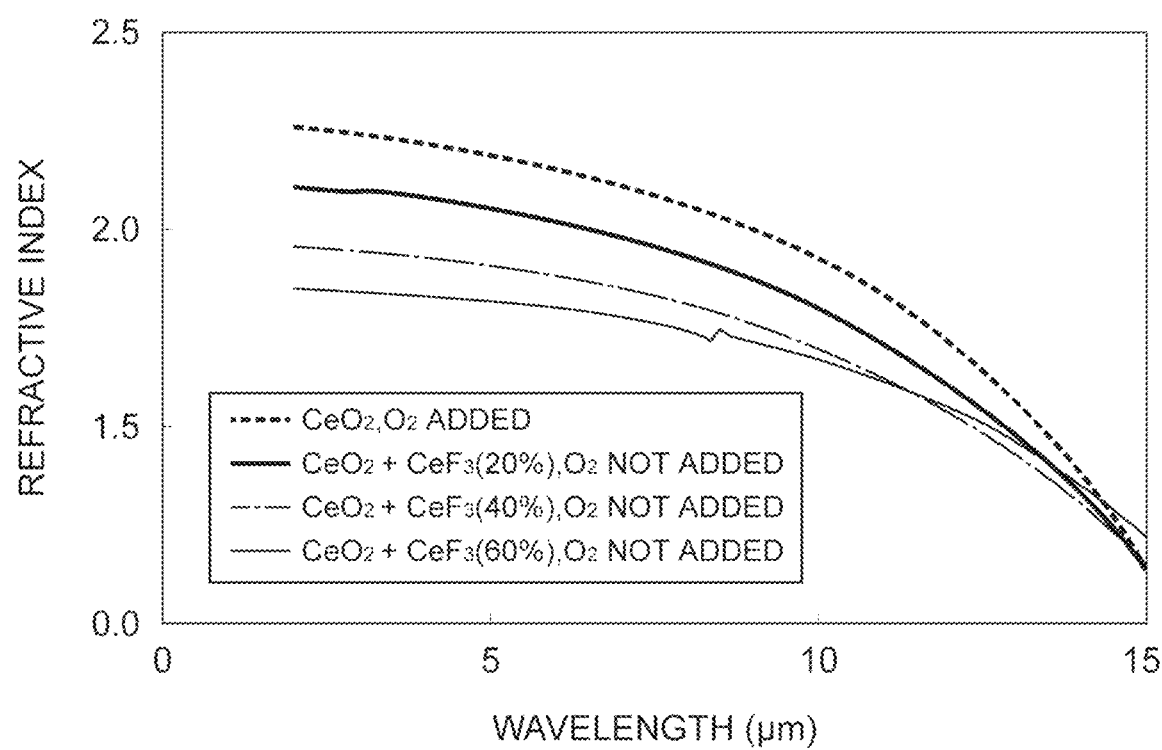
FIG. 6 is a graph showing a refractive index of a formed film.

Further, when a target consisting of only cerium oxide is used, a refractive index is 2 or more at the design wavelength λ=8 μm, and a desired value cannot be obtained (see FIG. 6 to be described below). When a target consisting of only cerium fluoride is used, an electric discharge resistance of a target is low, and repeated sputtering cannot be performed. When a target consisting of only yttrium fluoride is used, a stress of a formed anti-reflection film is too high, and cracking or the like tends to occur. Also, in film formation by a vapor deposition method, not only when a film is formed using the target 1 but also when a film is formed using a target consisting of only cerium oxide, a refractive index can be made 2 or less at the design wavelength λ=8 μm, but it is difficult to control optical characteristics thereof, a film quality is brittle, and it is difficult to form a film having a thickness of 1 μm or more.

<Quantum Cascade Laser>

Figure 2:
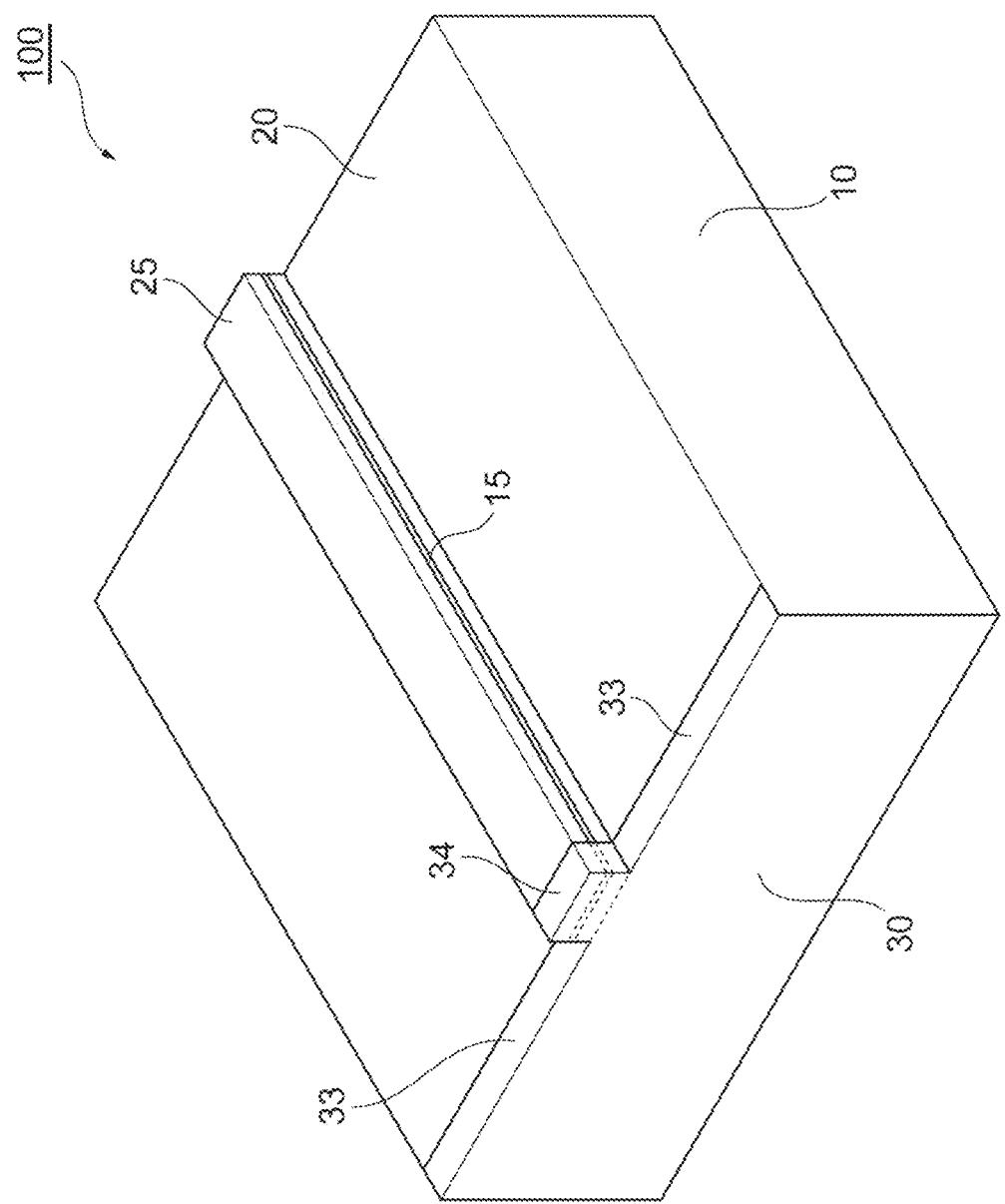
FIG. 2 is a perspective view illustrating a configuration of one embodiment of a quantum cascade laser.
Figure 3:
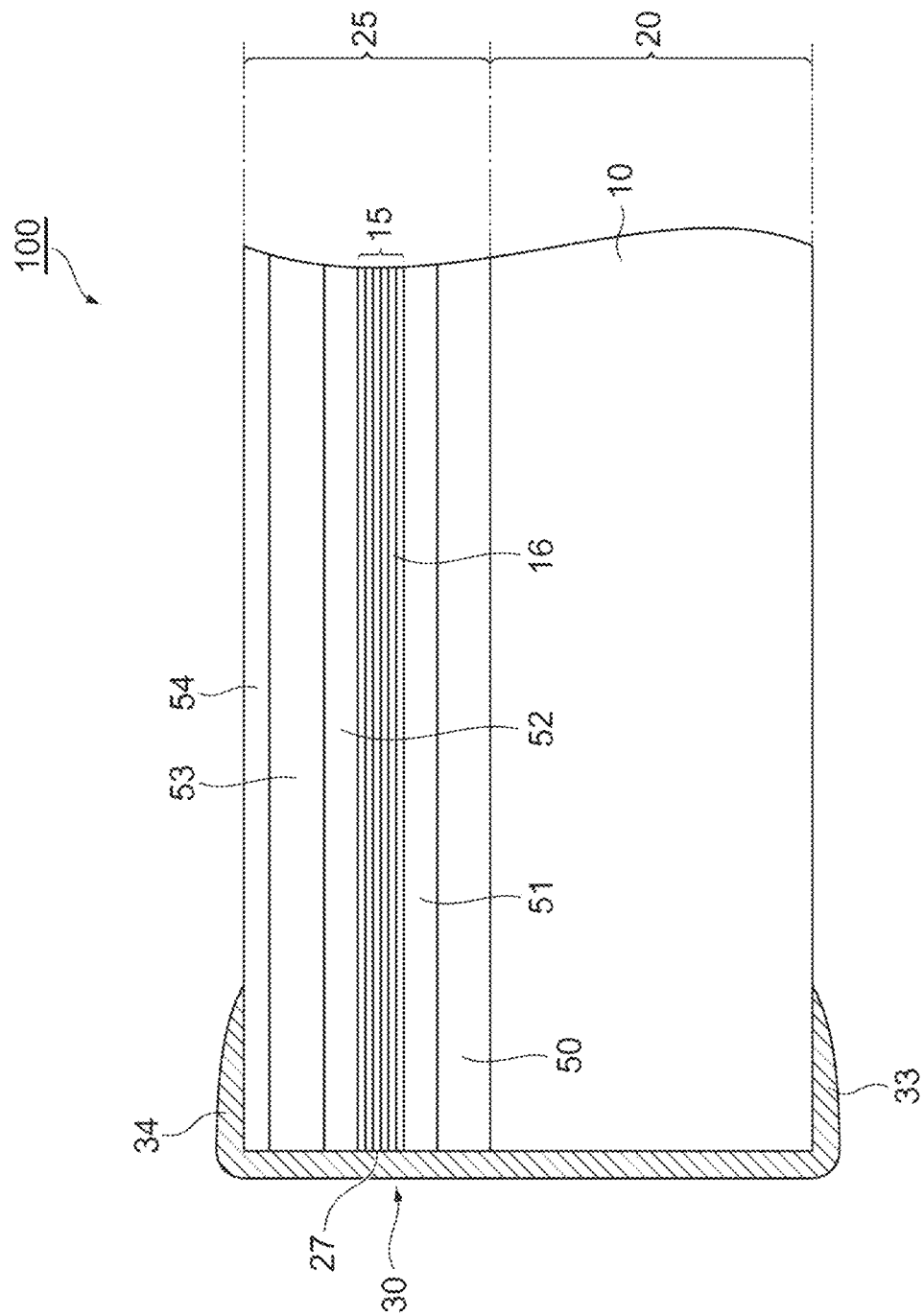
FIG. 3 is a side cross-sectional view illustrating a configuration of the quantum cascade laser illustrated in FIG. 2.

FIG. 2 is a perspective view schematically illustrating a configuration of one embodiment of a quantum cascade laser according to the present invention. Here, a quantum cascade laser of a distributed feedback (DFB) type in which a wavelength of emission light is 7 μm or more, 7.5 μm or more, or 8 μm or more is used. FIG. 3 is a side cross-sectional view illustrating a configuration of the quantum cascade laser illustrated in FIG. 2. Here, FIG. 3 illustrates a side cross-sectional view along a center line of a ridge part in a ridge structure of the laser device.

A quantum cascade laser 100 according to the present embodiment is a laser device of a monopolar type which generates light utilizing an inter-subband electron transition in a semiconductor quantum well structure. The quantum cascade laser 100 is configured to include a semiconductor substrate 10 and an active layer 15 formed on the substrate 10. Also, electrodes for driving the quantum cascade laser 100 are formed for the laser 100 on the substrate 10 side and a ridge part 25 side. However, illustration of the electrodes is omitted in FIGS. 2 and 3.

The active layer 15 has a cascade structure in which quantum well emission layers used for generating light and electron injection layers used for injecting electrons into the emission layers are alternately multistage-laminated. Specifically, when a semiconductor laminated structure formed of the quantum well emission layer and the injection layer is defined as a unit laminate 16 for one period and the unit laminates 16 are multistage-laminated (see FIG. 3), the active layer 15 having the cascade structure is formed. The number of laminations of the unit laminates 16 each including the quantum well emission layer and the injection layer is appropriately set. Also, the active layer 15 is formed directly on the semiconductor substrate 10 or via another semiconductor layer. Further, the quantum well structure in the active layer 15 and the resultant subband level structure will be described below in detail.

A specific example of a semiconductor laminated structure other than the semiconductor substrate 10 and the active layer 15 in the quantum cascade laser 100 is illustrated in FIG. 3. In the configuration example illustrated in FIG. 3, an n-type InP single crystal substrate is used as the semiconductor substrate 10. Then, a semiconductor laminated structure in an element main body of the quantum cascade laser 100 is formed on the InP substrate 10 by sequentially laminating an InP lower cladding layer 50, an InGaAs lower core layer 51, the active layer 15 in which the unit laminates 16 are multistage-laminated, an InGaAs upper core layer 52, an InP upper cladding layer 53, and an InGaAs contact layer 54 in order from the substrate side.

As illustrated in FIGS. 2 and 3, the quantum cascade laser 100 of the present embodiment is formed in the ridge structure including a base body part 20 having the semiconductor substrate 10, and the ridge part 25 having the active layer 15 and provided on the base body part 20. The ridge part 25 is formed in a stripe shape extending to join opposite sides of the base body part having a rectangular shape in a plan view. Also, the ridge part 25 is formed such that a stripe width thereof is smaller than a width of the base body part 20.

In the configuration example illustrated in FIG. 3, the ridge part 25 is configured to include the lower cladding layer 50, the lower core layer 51, the active layer 15, the upper core layer 52, the upper cladding layer 53, and the contact layer 54, and an end surface thereof includes a laser light emission end surface 27. Such a ridge-shaped laser element structure can be formed by a normal etching process. In this case, in the base body part 20, an upper surface of the semiconductor substrate 10 is configured to be exposed as an upper surface of the base body part 20.

Also, in the laser 100 of the present embodiment, an anti-reflection film 30 is formed on at least one end surface of both end surfaces of the ridge part 25. As illustrated in FIGS. 2 and 3, the anti-reflection film 30 is formed to be continuous from a ridge end surface of the ridge part 25 including one end portion in a direction in which the active layer 15 extends to a base body end surface of the base body part 20. The anti-reflection film 30 is formed on entire surfaces of the ridge end surface and the base body end surface. The anti-reflection film 30 is a single layer film and also functions as an insulating film.

Also, in the present embodiment, in addition to the base body end surface and the ridge end surface, the anti-reflection film 30 is configured to include an additional film part 33 additionally formed to wrap around an upper surface (surface on the ridge part 25 side) and a lower surface of the base body part 20 by a predetermined width from the base body part end surface, and an additional film part 34 additionally formed to wrap around an upper surface and both side surfaces of the ridge part 25 from the ridge end surface.

After the base body part 20, the ridge part 25, and electrodes are provided, the anti-reflection film 30 can be formed on one end surface thereof by the above-described method of film formation using the target 1.

A composition of the anti-reflection film 30 is the same as or similar to a composition of the target 1 used to form the anti-reflection film 30. That is, the composition includes cerium oxide and cerium fluoride or yttrium fluoride, and these are included at a predetermined content ratio. A content of the cerium fluoride or the yttrium fluoride in the anti-reflection film 30 may be 10 to 30% by mass and may be 15 to 25% by mass with respect to a total mass of the cerium oxide and the cerium fluoride or the yttrium fluoride in the anti-reflection film 30.

Also, in the anti-reflection film 30, the total content of the cerium oxide and the cerium fluoride or the yttrium fluoride is preferably 95% by mass or more, more preferably 98% by mass or more, still more preferably 99% by mass or more, and particularly preferably 99.5% by mass or more with respect to a mass of the anti-reflection film 30. Also, it is preferable that the anti-reflection film 30 substantially consist of cerium oxide and cerium fluoride or yttrium fluoride. Here, "substantially consist of cerium oxide and cerium fluoride or yttrium fluoride" means that, as described above, impurities which are inevitably mixed in the manufacturing process of the sintered body may be included. Also, it means that impurities which are inevitably mixed in the procedure of the film formation by sputtering may be included. Also, when oxygen is made present in an inert gas at the time of the sputtering, it means that oxygen may be taken into the film. Also, the anti-reflection film 30 may consist of only cerium oxide and cerium fluoride or yttrium fluoride. The "mass of the anti-reflection film 30" which is a reference of the above-described mass ratio may be the entire mass of the anti-reflection film 30 or a mass of a sample cut off for measuring the mass.

Figure 4:
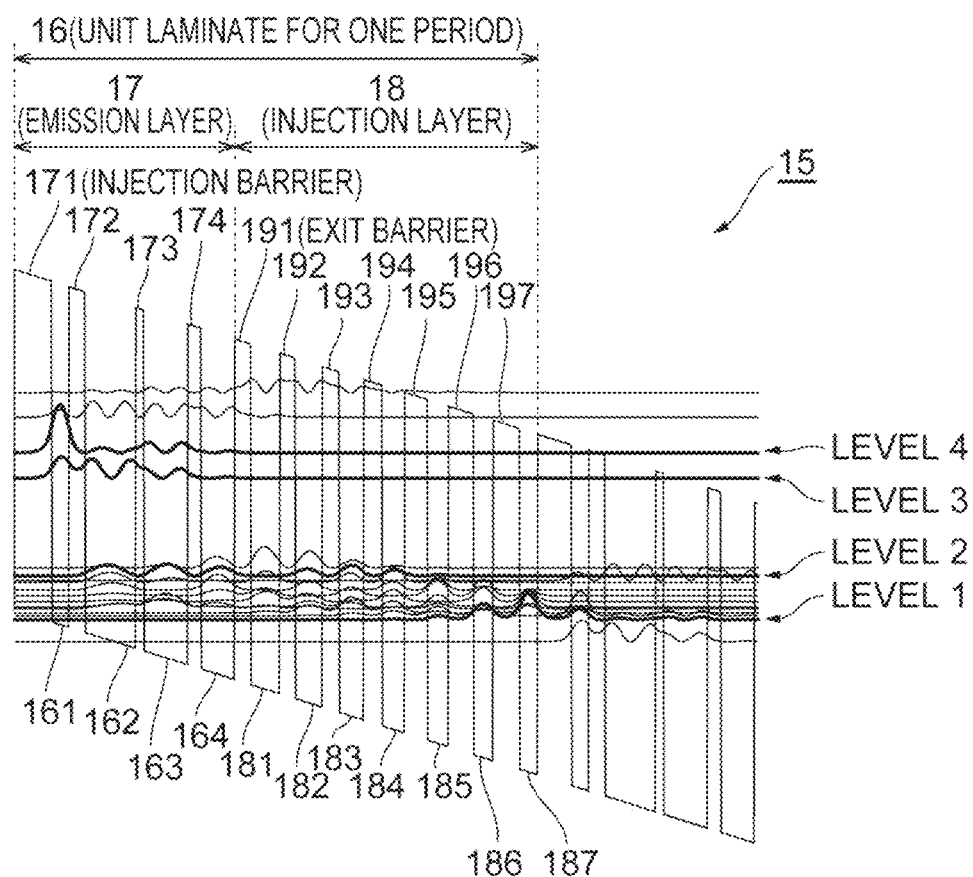
FIG. 4 is a view illustrating a configuration of an active layer of the quantum cascade laser and an example of a subband level structure in the active layer.

FIG. 4 is a view illustrating a configuration of the active layer of the quantum cascade laser 100 illustrated in FIG. 2 and an example of a subband level structure formed in the active layer. FIG. 4 schematically illustrates a quantum well structure and a subband level structure of a part of the multistage repeated structure of the unit laminates 16 in the active layer 15 of the quantum cascade laser 100. Also, in the drawing, a horizontal direction corresponds to a position in a lamination direction in the active layer, and a vertical direction corresponds to energy.

As illustrated in FIG. 4, the plurality of unit laminates 16 included in the active layer 15 are each formed of a quantum well emission layer 17 and an electron injection layer 18. The emission layer 17 and the injection layer 18 are each formed to have a predetermined quantum well structure including quantum well layers and quantum barrier layers. Thereby, a subband level structure, which is an energy level structure due to the quantum well structure, is formed in the unit laminate 16.

In the present configuration example, the unit laminate 16 for one period in the active layer 15 is formed as a quantum well structure in which eleven quantum well layers 161 to 164 and 181 to 187 and eleven quantum barrier layers 171 to 174 and 191 to 197 are alternately laminated. In such a laminated structure, a laminated portion including four well layers 161 to 164 and four barrier layers 171 to 174 is the emission layer 17, and a laminated portion including seven well layers 181 to 187 and seven barrier layers 191 to 197 is the injection layer 18.

Among the semiconductor layers of the emission layer 17, a first stage quantum barrier layer 171 is positioned between an injection layer of the previous stage and the emission layer 17 and serves as an injection barrier layer for electrons from the injection layer of the previous stage to the emission layer. Also, among the semiconductor layers of the injection layer 18, a first stage quantum barrier layer 191 is positioned between the emission layer 17 and the injection layer 18, and serves as an exit barrier layer for electrons from the emission layer to the injection layer.

The unit laminate 16 illustrated in FIG. 4 has two coupled emission upper levels (level 3 and level 4) and a emission lower level (level 2) as levels related to light emission due to inter-subband transition in the subband level structure of the unit laminate 16. Also, the unit laminate 16 has a relaxation level (level 1) which is an energy level lower than the lower level 2 in addition to the light emission upper level and the emission lower level.

In such a subband level structure, electrons $e^-$ from the injection layer of the previous stage are injected into the injection level 4 of the emission layer 17 via the injection barrier layer 171 by a resonance tunnel effect. Also, the electrons injected into the level 4 are also supplied to the level 3 by electron-electron scattering or the like, and the electrons are almost equally distributed in the levels 3 and 4. The electrons supplied to the levels 3 and 4 make laser transition to the lower level 2, and at this time, light hv having a wavelength corresponding to an energy difference between the subband levels of the levels 3 and 4 and the level 2 is generated. Also, electrons that have transitioned to the lower level 2 are relaxed to the relaxation level 1 by LO phonon scattering or the like and are pulled out. Thereby, population inversion for realizing laser oscillation between the upper levels 3 and 4 and the lower level 2 is formed.

Also, the electrons that have been relaxed to the relaxation level 1 are injected into an injection level of a emission layer in a subsequent stage via the exit barrier layer 191 and the injection layer 18. When such electron injection, laser transition, and relaxation are repeated in a plurality of unit laminates 16 of the active layer 15, light generation in a cascade manner occurs in the active layer 15. That is, when a large number of emission layers 17 and injection layers 18 are alternately laminated, electrons move in the laminate 16 one after another in a cascade manner, and the light hv having a predetermined wavelength is generated during the inter-subband transition in each laminate.

The active layer 15 of the present configuration example is configured by laminating the unit laminates 16 each including the quantum well emission layer 17 and the electron injection layer 18 for 40 cycles. Also, the unit laminate 16 for one period is configured as the quantum well structure in which eleven quantum well layers 161 to 164 and 181 to 187 and eleven quantum barrier layers 171 to 174 and 191 to 197 are alternately laminated in the same manner as in the configuration example schematically illustrated in FIG. 4.

In each of the semiconductor layers of the unit laminate 16, the quantum well layers are each formed of an InGaAs layer. Also, the quantum barrier layers are each formed of an InAlAs layer. Thereby, the active layer 15 is constituted by InGaAs/InAlAs quantum well structures. FIG. 5 illustrates an example of a specific structure of the unit laminate 16 for one period in the active layer 15. A wavelength of laser oscillation light in the present configuration example is $\lambda=8.5$ μm.

The quantum cascade laser 100 configured as described above includes the anti-reflection film 30 having a refractive index of 2 or less and a thickness of 1 μm or more as a single layer film. According to this, even when the laser 100 is continuously driven at a high output, the anti-reflection film 30 can withstand heat generation thereof, and a change of properties, cracking, peeling, or the like does not easily occur. Also, since the anti-reflection film 30 can be designed so that a reflectance is 1% or less as described above, an ideal light emission ability can be secured. Also, since the anti-reflection film 30 sufficiently functions with a single layer, design or film formation is facilitated. Therefore, it is not necessary to consider differences in stress and a thermal expansion coefficient between different materials compared to a case of a multilayer film.

The preferred embodiment of the present invention has been described above, but the present invention is not limited to the above-described embodiment at all. For example, the quantum cascade laser according to the present invention is not limited to the embodiment and the configuration example described above, and various modifications can be made. For example, in the above-described configuration example, an example in which an InP substrate is used as the semiconductor substrate and the active layer is constituted by InGaAs/InAlAs has been described, but, specifically, various configurations may be used as long as laser transition due to inter-subband transition in the quantum well structure is possible.

Also, the film according to the present invention can be applied not only to the anti-reflection film in the quantum cascade laser but also to an incident surface of a detector having a detection sensitivity at wavelengths of 7 μm or more. Further, the present invention can be applied to coating on optical components such as window materials, lenses, or filters.

EXAMPLE

Hereinafter, the content of the present invention will be described more specifically with reference to experimental examples. The present invention is not limited to the following experimental examples.

Experimental Example 1

A granular agglomerate of cerium oxide and a granular agglomerate of cerium fluoride were each pulverized and were mixed to be 80% by mass and 20% by mass in terms of mass ratio, respectively. After uniform mixing, the mixture was packed in a mold, compression molded, and sintered at 900° C. A shape thereof was columnar, a diameter of the bottom was 75 mm, and a height was 4 mm. The sintered body was used as a sputtering target, a copper plate was adhered thereto as a backing plate, and a film (film 1) was formed on a silicon wafer by sputtering in an argon atmosphere. Also, a mixture ratio of cerium oxide and cerium fluoride was set to 60% by mass and 40% by mass, and, in the same way, a film (film 2) was formed on a silicon wafer by sputtering in an argon atmosphere. Also, a mixture ratio of cerium oxide and cerium fluoride was set to 40% by mass and 60% by mass, and, in the same way, a film (film 3) was formed on a silicon wafer by sputtering in an argon atmosphere. Also, a sintered body consisting of only cerium oxide was manufactured in the same way, and a film (film 4) was formed on a silicon wafer by sputtering using the sintered body as a sputtering target in a state in which oxygen was added and mixed at a partial pressure of 10% in an argon atmosphere. Also, a sintered body consisting of only cerium fluoride was manufactured in the same way, and an attempt was made to form a film using the sintered body as a sputtering target, but a surface of the target was damaged by a single electric discharge and the film could not be formed sufficiently.

Thicknesses of the films 1 and 4 were measured using "Spectroscopic Ellipsometry IR-VASE" (manufactured by J. A. Woollam). A thickness of the film 1 was 1.12 μm, and a thickness of the film 4 was 1.05 μm. In both of the films 2 and 3, cracking occurred immediately after the film formation, and film thicknesses thereof were 0.5 μm. That is, when the mixing ratio of the cerium fluoride was 40% by mass or 60% by mass, electric discharge resistance of the sputtering target was satisfactory, but the films formed thereby were not practically durable.

Refractive indexes of the films 1, 2, 3, and 4 were measured using "Spectroscopic Ellipsometry IR-VASE" (manufactured by J. A. Woollam). The results are shown in FIG. 6. According to FIG. 6, it is ascertained that the film (film 4) formed of only cerium oxide has a refractive index of more than 2 at a wavelength of 8 μm, whereas the films (film 1, film 2, and film 3) formed of cerium oxide and cerium fluoride have refractive indexes of less than 2 at a wavelength of 7 μm or more.

Experimental Example 2

Also, a film (film 5) was formed on a silicon wafer by sputtering using the above-described sputtering target consisting of 80% by mass of cerium oxide and 20% by mass of cerium fluoride with a copper plate adhered thereto as a backing plate in a state in which oxygen was added and mixed at a partial pressure of 10% in an argon atmosphere. Here, a thickness of the film 5 was 1.12 μm.

Figure 7:
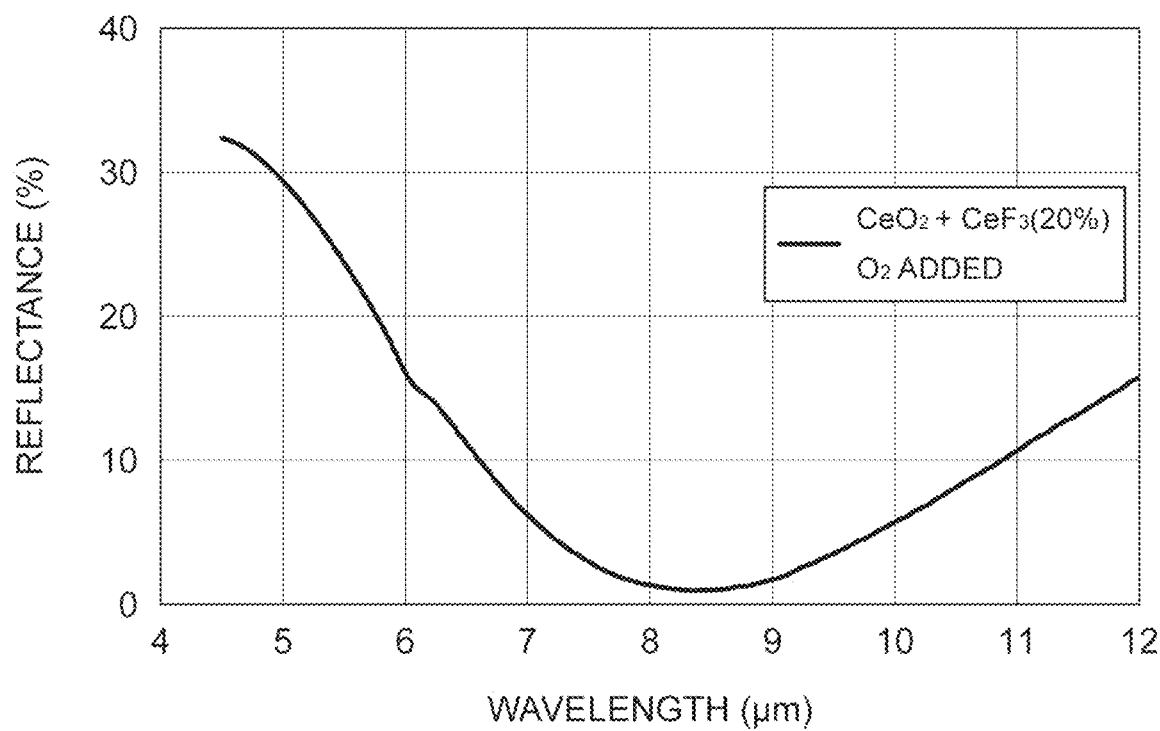
FIG. 7 is a graph showing reflectance of a formed film.

A reflectance of the film 5 was measured using a "Fourier transform infrared spectrophotometer" (manufactured by JASCO Corporation). The results are shown in FIG. 7. According to FIG. 7, it is ascertained that a reflectance thereof at a wavelength of 8.3 μm is 1% or less.

Figure 8:
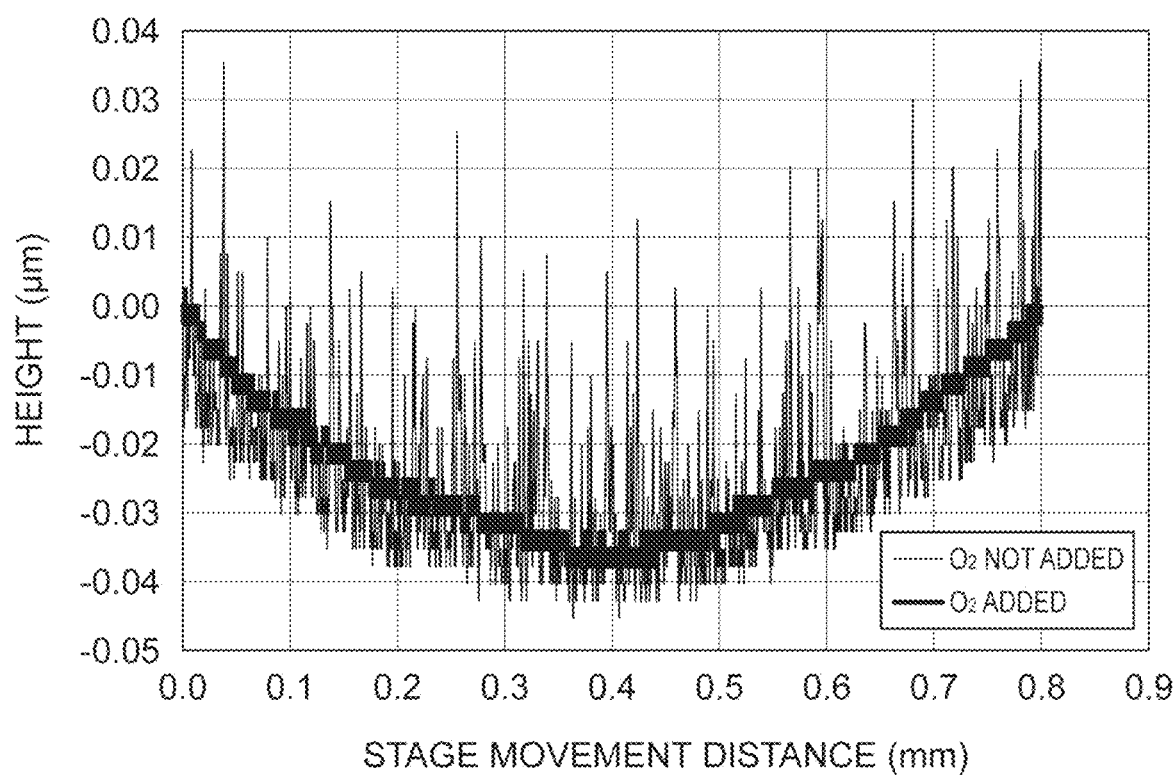
FIG. 8 is a graph showing surface roughness of a formed film.

Surface roughness of the films 1 and 5 was measured using a "fine shape measuring device ET-200" (manufactured by Kosaka Laboratory Ltd.). The results are shown in FIG. 8. According to FIG. 8, it is ascertained that the surface roughness is smaller when oxygen is added during sputtering.

Experimental Example 3

A quantum cascade laser having the configurations illustrated in FIGS. 2, 3 and 5 was manufactured. Here, an anti-reflection film was formed using the above-described sputtering target consisting of 80% by mass of cerium oxide and 20% by mass of cerium fluoride. After an upper surface of the base body part and the ridge part were soldered to a heat sink, when the quantum cascade laser was continuously driven at 20° C. and 0.8 A for 24 hours, a change of properties, cracking, or peeling did not occur in the anti-reflection film.

Experimental Example 4

A quantum cascade laser having the configurations illustrated in FIGS. 2, 3 and 5 was manufactured. Here, an anti-reflection film was formed using a sintered body consisting of only yttrium fluoride as a sputtering target. Immediately after the film formation, cracking had already occurred on the anti-reflection film.

The present invention can be utilized, for example, for forming an anti-reflection film in a manufacturing process of a quantum cascade laser.

EXPLANATION OF REFERENCES

1 Sputtering target, 2 Semiconductor substrate, 15 Active layer, 16 Unit laminate, 17 Quantum well emission layer, 18

Electron injection layer, 20 Base body part, 25 Ridge part, 27 Emission end surface, 30 Anti-reflection film, 33, 34 Additional film part, 50 Lower cladding layer, 51 Lower core layer, 52 Upper core layer, 53 Upper cladding layer, 54 Contact layer, 100 Quantum cascade laser

What is claimed is:

1. A quantum cascade laser comprising:
a semiconductor substrate; and
an active layer provided on the semiconductor substrate, having a cascade structure in which quantum well emission layers and injection layers are alternately laminated by multistage-laminating unit laminates each formed of the quantum well emission layer and the injection layer, and configured to generate light due to inter-subband transition in a quantum well structure, wherein
an anti-reflection film is provided on an emission end surface from which light having a predetermined wavelength generated in the active layer is emitted,
the anti-reflection film is formed of a single layer film comprising (i) cerium oxide and cerium fluoride or (ii) cerium oxide and yttrium fluoride, and
wherein a content of the cerium fluoride is 10 to 30% by mass with respect to a total mass of the cerium oxide and the cerium fluoride, or a content of the yttrium fluoride is 10 to 30% by mass with respect to a total mass of the cerium oxide and the yttrium fluoride.

2. The quantum cascade laser according to claim 1, wherein a thickness of the single layer film is 1.000 to 1.300 μm.

3. The quantum cascade laser according to claim 1, wherein the predetermined wavelength of emission light is 7 μm or more.

4. The quantum cascade laser according to claim 1, wherein the anti-reflection film has a reflectance being 1% or less at the predetermined wavelength.

* * * * *